United States Patent
Li et al.

(10) Patent No.: US 9,383,266 B1
(45) Date of Patent: Jul. 5, 2016

(54) TEST STRUCTURE TO MONITOR THE IN-SITU CHANNEL TEMPERATURE OF FIELD EFFECT TRANSISTORS

(71) Applicant: HRL Laboratories, LLC, Malibu, CA (US)

(72) Inventors: James Chingwei Li, Simi Valley, CA (US); Tahir Hussain, Calabasas, CA (US)

(73) Assignee: HRL Laboratories, LLC, Malibu, CA (US)

( * ) Notice: Subject to any disclaimer, the term of this patent is extended or adjusted under 35 U.S.C. 154(b) by 450 days.

(21) Appl. No.: 14/054,693

(22) Filed: Oct. 15, 2013

Related U.S. Application Data

(62) Division of application No. 12/499,603, filed on Jul. 8, 2009, now Pat. No. 8,587,037.

(51) Int. Cl.
  *H01L 29/417* (2006.01)
  *H01L 29/423* (2006.01)
  *H01L 21/66* (2006.01)
  *H01L 21/768* (2006.01)
  *G01K 7/22* (2006.01)

(52) U.S. Cl.
  CPC .......................... *G01K 7/22* (2013.01)

(58) Field of Classification Search
  CPC ........................................................ G01K 7/22
  See application file for complete search history.

(56) References Cited

U.S. PATENT DOCUMENTS

| | | | |
|---|---|---|---|
| 8,072,035 B2 * | 12/2011 | Terada | H01L 29/78 257/409 |
| 2009/0066404 A1 * | 3/2009 | Heppenstall | H01L 27/0248 327/513 |
| 2009/0159977 A1 * | 6/2009 | Itou | H01L 21/823437 257/368 |
| 2009/0189248 A1 | 7/2009 | Kitamura et al. | |
| 2009/0315086 A1 * | 12/2009 | Arimoto | H01L 27/14609 257/292 |
| 2012/0018841 A1 * | 1/2012 | Kitamura | H01L 23/5252 257/530 |

OTHER PUBLICATIONS

From U.S. Appl. No. 12/499,603 (now U.S. Pat. No. 8,587,037), Office Action dated Apr. 5, 2012.
From U.S. Appl. No. 12/499,603 (now U.S. Pat. No. 8,587,037), Office Action dated Aug. 14, 2012.
From U.S. Appl. No. 12/499,603 (now U.S. Pat. No. 8,587,037), Office Action dated Dec. 5, 2012.
From U.S. Appl. No. 12/499,603 (now U.S. Pat. No. 8,587,037), Office Action dated Feb. 5, 2013.
From U.S. Appl. No. 12/499,603 (now U.S. Pat. No. 8,587,037), Office Action dated Feb. 22, 2013.
From U.S. Appl. No. 12/499,603 (now U.S. Pat. No. 8,587,037), Office Action dated May 16, 2013.

(Continued)

*Primary Examiner* — Victor A Mandala
(74) *Attorney, Agent, or Firm* — Ladas & Parry

(57) ABSTRACT

A field effect transistor (FET) having a source, a drain and a gate includes a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate. By performing gate resistance measurements at different ambient temperatures, a thermal coefficient of gate resistance can be derived and then used to monitor the gate temperature, which is representative of the channel temperature.

16 Claims, 7 Drawing Sheets

(56) References Cited

OTHER PUBLICATIONS

From U.S. Appl. No. 12/499,603 (now U.S. Pat. No. 8,587,037), Office Action dated Jul. 3, 2013.
From U.S. Appl. No. 12/499,603 (now U.S. Pat. No. 8,587,037), Office Action dated Jul. 15, 2013.
From U.S. Appl. No. 12/499,603 (now U.S. Pat. No. 8,587,037), Office Action dated Jul. 15, 2013. Notice of Allowance.
From U.S. Appl. No. 12/499,603 (now U.S. Pat. No. 8,587,037), Office Action dated Oct. 30, 2013.
Hussain T. et al., "GaN HFET digital circuit technology", Electronics Letters, vol. 39, Issue 24, pp. 1708-1709 (2003).

* cited by examiner

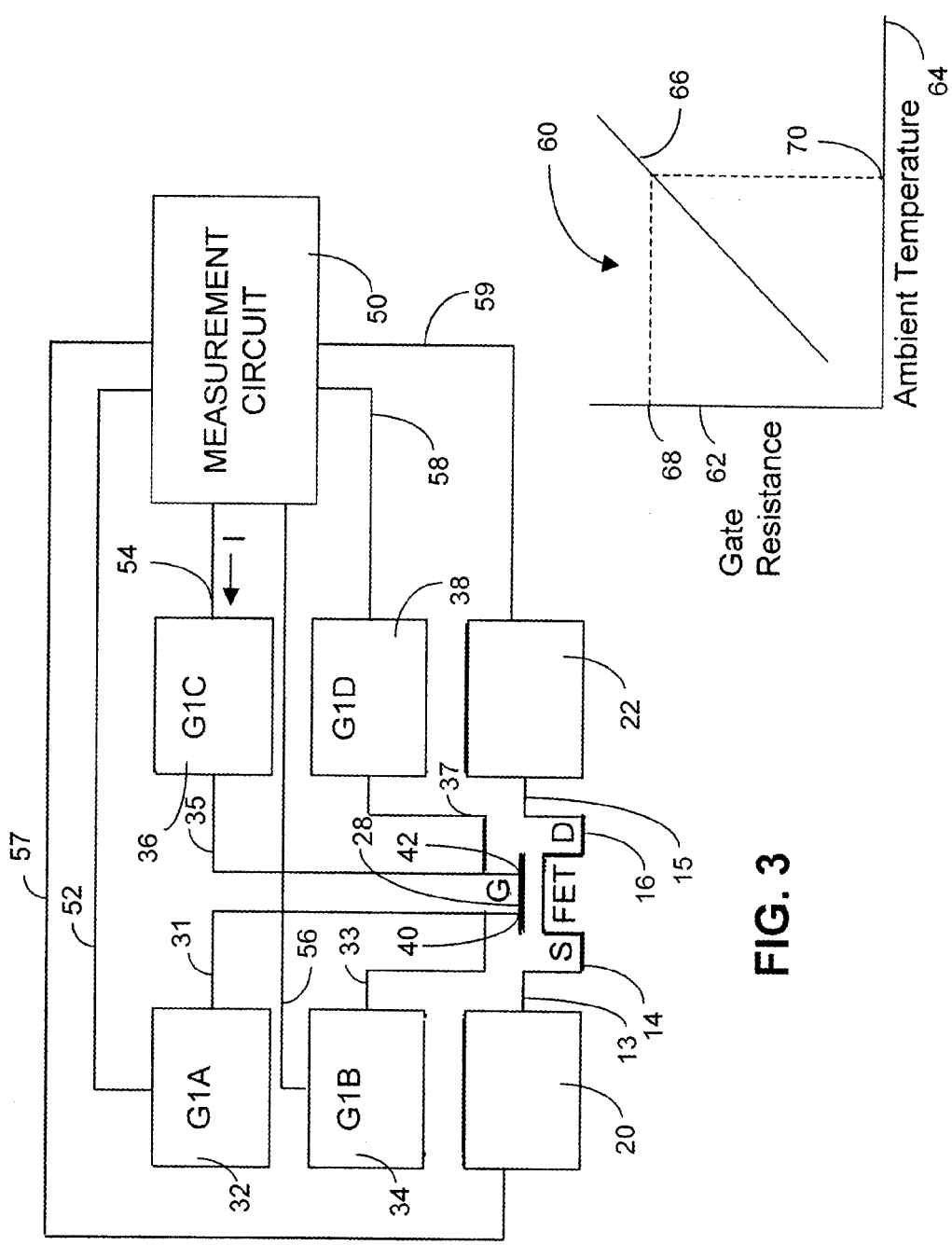

PROVIDING THE FET WITH A FIRST CONNECTION ELECTRICALLY CONNECTED TO THE GATE NEAR A FIRST END OF THE GATE, A SECOND CONNECTION ELECTRICALLY CONNECTED TO THE GATE NEAR THE FIRST END OF THE GATE, A THIRD CONNECTION ELECTRICALLY CONNECTED TO THE GATE NEAR A SECOND END OF THE GATE, AND A FOURTH CONNECTION ELECTRICALLY CONNECTED TO THE GATE NEAR THE SECOND END OF THE GATE — 100

SENSING A FIRST AMBIENT TEMPERATURE OF THE FET — 102

APPLYING A FIRST VOLTAGE TO THE FIRST CONNECTION — 104

FORCING A CURRENT INTO THE THIRD CONNECTION — 106

SENSING A SECOND VOLTAGE ACROSS THE SECOND AND FOURTH CONNECTIONS — 108

DIVIDING THE SENSED SECOND VOLTAGE BY THE CURRENT TO OBTAIN A FIRST GATE RESISTANCE ASSOCIATED WITH THE FIRST AMBIENT TEMPERATURE — 110

APPLYING A FIRST VOLTAGE TO THE FIRST CONNECTION 118

FORCING CURRENT INTO THE THIRD CONNECTION 120

SENSING A FOURTH VOLTAGE ACROSS THE SECOND AND FOURTH CONNECTIONS 122

DIVIDING THE SENSED FOURTH VOLTAGE BY THE CURRENT TO OBTAIN A THIRD GATE RESISTANCE 124

DIVIDING THE THIRD GATE RESISTANCE BY THE DERIVED TEMPERATURE COEFFICIENT OF RESISTANCE TO DETERMINE A GATE TEMPERATURE 126

FIG. 6C

TEST STRUCTURE TO MONITOR THE IN-SITU CHANNEL TEMPERATURE OF FIELD EFFECT TRANSISTORS

CROSS REFERENCE TO RELATED APPLICATION

This is a divisional application of U.S. patent application Ser. No. 12/499,603, filed on Jul. 8, 2009, which is incorporated herein as though set forth in full.

FIELD

This disclosure relates to field effect transistors (FETs), and in particular to test structures and methods for monitoring the channel temperature of FETs.

BACKGROUND

There are two known prior art methods for measuring the on-chip temperature of a FET based integrated circuit. The first is to use thermal diodes, which may be on-chip or near the chip being monitored. This method requires a well characterized and stable diode. For measuring the on-chip temperature of a FET, a gate schottky diode, a gate p-n diode, a source to body diode, or a drain to body diode may be used. These on-chip thermal diodes work well when the current-voltage (IV) characteristic has a known dependence on temperature. Most technologies based on silicon rely on thermal diodes to determine the on-chip temperature. However, generally only a small number and sometimes only one thermal diode is placed on-chip so only an average chip temperature can be measured. This may not be sufficient when many circuits need to be monitored. Even if more thermal diodes are placed on-chip, the proximity of the thermal diodes to the location on a circuit to be measured is generally limited to distances much greater than a micron, which lowers the accuracy of the temperature measurement.

Thermal diodes can provide reasonably accurate continuous real-time data; however, a key disadvantage with this method is that many compound semiconductors, such as GaN, SiC, and GaAs, are not mature enough to have well characterized and stable thermal diodes.

Another method is to use an infrared (IR) camera. This method involves using a rather bulky camera that is usually several thousand times the volume of the actual integrated circuit to produce a 2D temperature profile of the integrated circuit surface. Because this method requires a camera, it is suitable for monitoring the temperature of developmental and engineering prototypes, but not for monitoring the temperature of integrated circuits in use in commerce. Another disadvantage is that the IR radiation used by the camera limits the spatial resolution to approximately 10 microns; however, the region of interest may have critical dimensions less than one micron. Furthermore, this method only provides the average integrated circuit surface temperature within the spatial resolution of the IR camera.

Accurate monitoring of the temperature of FETs during operation is especially important when they are used in high power applications such as in electric vehicles. In the prior art substantial amounts of cooling equipment are used to maintain the temperature of the FETs below their theoretic capability. By monitoring the temperature of the FETs during operation, the FETs can be safely operated at a higher temperature thereby reducing the amount of cooling equipment and saving cost and weight.

What are needed are test structures and methods for accurately monitoring the channel temperature of FETs. Also needed are test structures and methods for monitoring the channel temperature of FETs built with compound semiconductors, such as GaN, SiC, and GaAs. The embodiments of the present disclosure answer these and other needs.

SUMMARY

In a first embodiment disclosed herein, a field effect transistor (FET) having a source, a drain and a gate includes a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate.

In another embodiment disclosed herein, a circuit for monitoring a temperature in a field effect transistor (FET) having a source, a drain and a gate comprises a current source electrically connected to the gate near the first end of the gate and electrically connected to the gate near the second end of the gate, and a voltage sensor electrically connected to the gate near the first end of the gate and electrically connected to the gate near the second end of the gate.

In yet another embodiment disclosed herein, a method for monitoring a temperature in a field effect transistor (FET) having a source, a drain and a gate comprises providing the FET with a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate, sensing a first ambient temperature of the FET, forcing a first current from the third connection to the first connection, sensing a first voltage across the second and fourth connection, and dividing the sensed first voltage by the current to obtain a first gate resistance associated with the first ambient temperature.

In yet another embodiment disclosed herein, a method for monitoring a temperature in a field effect transistor (FET) having a source, a drain and a gate, and having a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate includes providing a temperature coefficient of gate resistance, forcing a current from the third connection to the first connection, sensing a second voltage across the second connection and the fourth connection, dividing the sensed second voltage by the current to obtain a gate resistance, and dividing the gate resistance by the provided temperature coefficient of gate resistance to determine a gate temperature.

In another embodiment disclosed herein, a field effect transistor (FET) having a source, a drain and a gate, the FET comprises a first connection electrically connected to the gate near a first end of the gate, and a second connection electrically connected to the gate near a second end of the gate.

In yet another embodiment disclosed herein, a circuit for monitoring a temperature in a field effect transistor (FET) having a source, a drain and a gate comprises a current source electrically connected between a first end of the gate and a second end of the gate, a voltage sensor electrically connected to the first end of the gate and to the second end of the gate.

In still another embodiment disclosed herein, a method for monitoring a temperature in a field effect transistor (FET) having a source, a drain and a gate comprises providing the FET with a first connection electrically connected to the gate near a first end of the gate, and a second connection electrically connected to the gate near a second end of the gate, sensing a first ambient temperature of the FET, forcing a first current from the first connection to the second connection, sensing a first voltage between the first connection and the second connection, and dividing the sensed first voltage by the first current to obtain a first gate resistance associated with the first ambient temperature.

In yet another embodiment disclosed herein, in a method for monitoring a temperature in a field effect transistor (FET) having a source, a drain and a gate, and having a first connection electrically connected to the gate near a first end of the gate, and a second connection electrically connected to the gate near a second end of the gate, the method comprises providing a temperature coefficient of gate resistance, forcing a current from the first connection to the second connection, sensing a voltage between the first connection and the second connection, dividing the sensed voltage by the current to obtain a gate resistance, and dividing the gate resistance by the provided temperature coefficient of gate resistance to determine a gate temperature.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 3 shows the FET of FIG. 2 connected to a measurement circuit in accordance with the present disclosure;

FIG. 4 is an example graph showing the FET gate resistance versus FET ambient temperature in accordance with the present disclosure;

FIGS. 6A-6C are flow diagrams of a method for monitoring a temperature in a field effect transistor (FET) in accordance with the present disclosure;

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

Figures 1, 2:
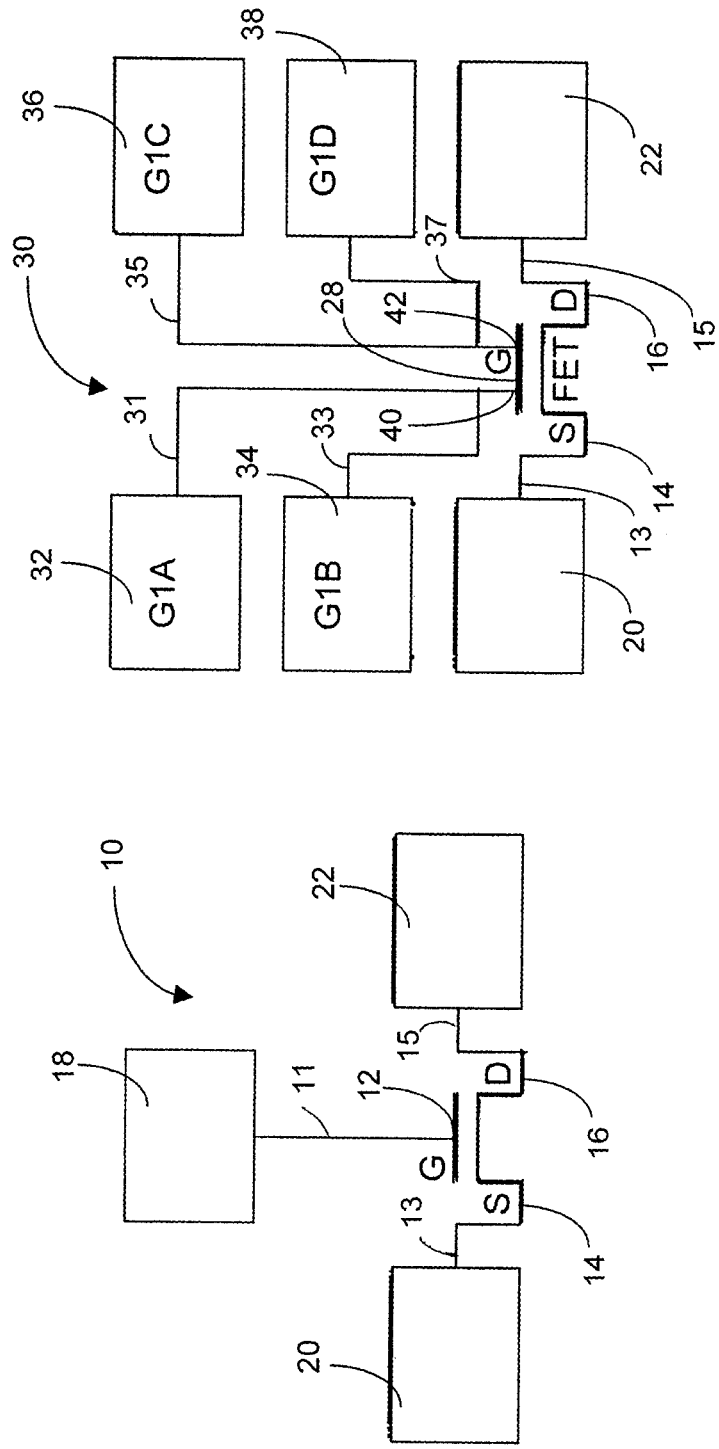
FIG. 1 shows a representative FET in accordance with the prior art.
FIG. 2 shows an FET with test structures for monitoring the channel temperature in accordance with the present disclosure.

Referring to FIG. 1, a representative FET 10 in accordance with the prior art is shown. FET 10 has a gate 12, a source 14 and a drain 16. The FET 10 and the FETs described throughout this disclosure may be any type of FET including but not limited to Metal-Oxide-Semiconductor FETs (MOSFETs), Metal-Semiconductor FETs (MOSFETs), Metal-insulator-semiconductor FETs (MOSFETs), junction FETs (JFETs), and heterojunction FETs (HFETs). Connections may be made to the gate 12, source 14 and drain 16 of the FET 10 by metal interconnects to vias or pads on a substrate. For example, pad 18 is connected to the gate 12 by metal interconnect 11, pad 20 is connected to the source 14 by metal interconnect 13, and pad 22 is connected to the drain 16 by metal interconnect 15, all of which may be on a substrate (not shown).

FIG. 2 shows an FET 30 with integral test structures for monitoring the channel temperature in accordance with the present disclosure. As described further below, these integral test structures provide the means for monitoring the FET gate temperature and thereby the FET channel temperature. The source 14 and drain 16 are electrically connected in a similar manner to that described in relation to FIG. 1. However, instead of the gate 28 in the FET 30 having only one connection, as shown for the prior art gate 12 in FIG. 1, gate 28 has four connections. There are two connections from pads G1A 32 and G1B 34 that connect to gate 28 near a first end 40 of the gate 28, and two connections from pads G1C 36 and G1D 38 that connect to the gate 28 near a second end 42 of the gate 28. A person skilled in the art will understand that the two connections to each end of gate 28 can be made by various means including pads, vias, and other forms of interconnect. In FIG. 2, pad G1A 32 is electrically connected to the first end 40 of gate 28 by metal interconnect 31 and pad G1B 34 is electrically connected to the first end 40 of gate 28 by metal interconnect 33. Also in FIG. 2 pad G1C 36 is electrically connected to the second end 42 of gate 28 by metal interconnect 35 and pad G1D 38 is electrically connected to the second end 42 of gate 28 by metal interconnect 37.

If the temperature dependence of the gate resistance defined as the resistance between the first end 40 of the gate 28 and the second end 42 of the gate 28 is characterized, then the temperature of the channel between the source 14 and the drain 16 of the FET 30 may be accurately monitored, because the gate 28 may be no more than 25 nanometers away from the channel. So if the gate temperature can be monitored, then the channel temperature can be monitored with high accuracy.

FIG. 3 shows the FET 30 of FIG. 2 connected to a measurement circuit 50 in accordance with the present disclosure. Measurement circuit 50 is used to measure the temperature dependence of the resistance between the first end 40 of the gate 28 and the second end 42 of the gate 28. Measurement circuit 50 may be implemented by test equipment, a circuit on the same substrate as FET 30, an IC on a different substrate but in the same package as FET 30, or any combination of these. Having the measurement circuit separate may be preferable in order to thermally isolate the measurement circuit 50 from the FET 30.

In one embodiment, the temperature dependence of the resistance between the first end 40 of the gate 28 and the second end 42 of the gate 28 is measured by forcing zero volts on pad G1A 32 via line 52, which is connected between the measurement circuit 50 and pad G1A 32. Then a fixed current (I) is forced into pad G1C 36 via line 54, which is connected between the measurement circuit 50 and pad G1C 36. The current travels from pad G1C 36 to the second end 42 of the gate 28, then through gate 28 to the first end 40 of the gate 28 and to pad G1A 32 and back to the measurement circuit via line 52.

A first sense probe may be connected from the measurement circuit 50 to pad G1D 38 via line 58 and a second sense probe may be connected from the measurement circuit 50 to pad G1B 34 via line 56. These first and second sense probes may be Kelvin probes, which are well known to those skilled in the art and have very high impedance. By using high impedance probes, very little or no current flows through pad G1B 34 or through pad G1D 38 or connections to the pads.

By sensing the voltage between the first and second sense probes the voltage difference between the first end 40 and second end 42 of the gate 28 can be measured with high accuracy. This voltage difference V is caused by the current forced via pad G1C 36 through gate 28 from the second end 42 to the first end 40 and the gate resistance, and is the result of the well known relation V=I×R, where I is the forced current and R is the gate 28 resistance between the first end 40 and the second end 42 of gate 28.

Because the forced current I is known, once the voltage difference V is measured, then the gate 28 resistance between the first end 40 and the second end 42 of gate 28 is calculated from the well known relation R=V/I.

The magnitude of current I forced into pad G1C 36 cannot result in a voltage across the gate 28 that is comparable to the turn-on voltage of a gate Schottky diode in the case of HFET or JFET type devices, because if the voltage across the gate 28 was such that the gate Schottky diode turned on, then the forced current would be directed through the diode rather the gate, which would interfere with measuring the voltage difference across the gate 28 to obtain the gate resistance.

The measurement of the voltage difference between the first end 40 and second end 42 of the gate 28 may then be repeated at various ambient temperatures of the FET 30. The ambient temperature of the FET 30 may be varied by cooling or heating up the area or surfaces surrounding the FET 30, such as, for example, the substrate upon which the FET 30 is mounted or a case in which the FET 30 is packaged. All of the measurements should be performed with no voltage at the source 14 or drain 16 and no current passing through the source 14 or drain 16.

The gate resistance derived from the voltage difference measurements between the first end 40 and second end 42 of the gate 28 for each ambient temperature may then be plotted versus the ambient temperature. FIG. 4 shows an example graph showing the linear relationship 66 between a FET gate resistance 62 on the y axis and the FET ambient temperature 64 on the x axis. For example, the gate resistance corresponding to ambient temperature 70 is gate resistance 68. The slope of the linear relationship 66 is the gate resistance change per ambient temperature change and is the Temperature Coefficient of Resistance (TCR) for the gate 28.

The temperature dependence of the gate resistance is expected to be linear, but need not be linear. The user can repeat the gate resistance measurement at as many ambient temperatures as deemed necessary. In the case where the gate resistance is not linear with temperature, the measured gate resistance versus temperature can act as a lookup table.

Once the Temperature Coefficient of Resistance (TCR) for the gate 28 is derived by performing the above process or constructing a lookup table, the gate resistance measurement can be performed with the source and drain biased. In a common configuration, the source 14, which is connected with metal interconnect 13 to pad 20, may be set to zero volts via line 57 from measurement circuit 50, and the drain 16, which is connected with metal interconnect 15 to pad 22, may be set to a positive voltage via line 59 from measurement circuit 50. The positive voltage applied to the drain 22 can be varied to change the bias between the source 14 and the drain 16.

When the source 14 and the drain 16 are biased, the current forced from the measurement circuit 50 into G1C 36 should be constrained so that the resulting voltage difference across from the first end 40 to the second end 42 of the gate 28 does not result in a significant difference in the forced gate to source voltage ($V_{GS}$); otherwise, current in the channel between the source 14 and the drain 16 may spatially vary along the length of the gate 28, which would lower the accuracy of the measurement.

The derived gate resistance under source 14 to drain 16 bias, which is again calculated from the well known relation R=V/I, can be converted into a gate 28 temperature for each bias between the source 14 and the drain 16 by dividing the gate resistance by the Temperature Coefficient of Resistance (TCR) previously derived for the gate 28. Because the gate 28 may be no more than 25 nanometers away from the channel between the source 14 and the drain 16, the channel temperature can be monitored with high accuracy.

Different gate bias voltages can also be applied by changing the voltage on the pad G1A 32 connected to the first end of 40 of gate 28.

In another embodiment there are only two extra connections to the gate 28. In this embodiment pads G1B 34 and G1D 38, shown in FIG. 3 are eliminated and instead the voltage measurements are performed across pads G1A 32 and G1C 36, rather than across pads G1B 34 and G1D 38. This reduces the area required for pads, but provides less voltage measurement accuracy.

In yet another embodiment each of the pads G1B 34 and G1D 38 are a pad pair instead of a single pad.

In another embodiment the measurement circuit 50, which sources current on line 54 to pad G1C 36 and a single voltage on line 52 to pad G1A 32, may include a second current source that forces an equal but negative current on pad G1A 32. This second current source prevents the current injected into pad G1C 36 from exiting the gate into the channel. This is particularly useful for applications with JFETs or HFETs without a gate insulator.

Using the FET design and the measurement circuit described above, the channel temperature of the FET 30 can be continuously monitored while the FET is in normal operation. This is especially important for FETs that are used for power electronics to improve their performance and reliability. Many other applications utilizing multiple FET gates in parallel with one another are also expected to benefit from this method over the prior art. In these prior art devices there is only one connection to each gate, as shown for gate 12 in the prior art FET 10 shown in FIG. 1.

Figure 5:
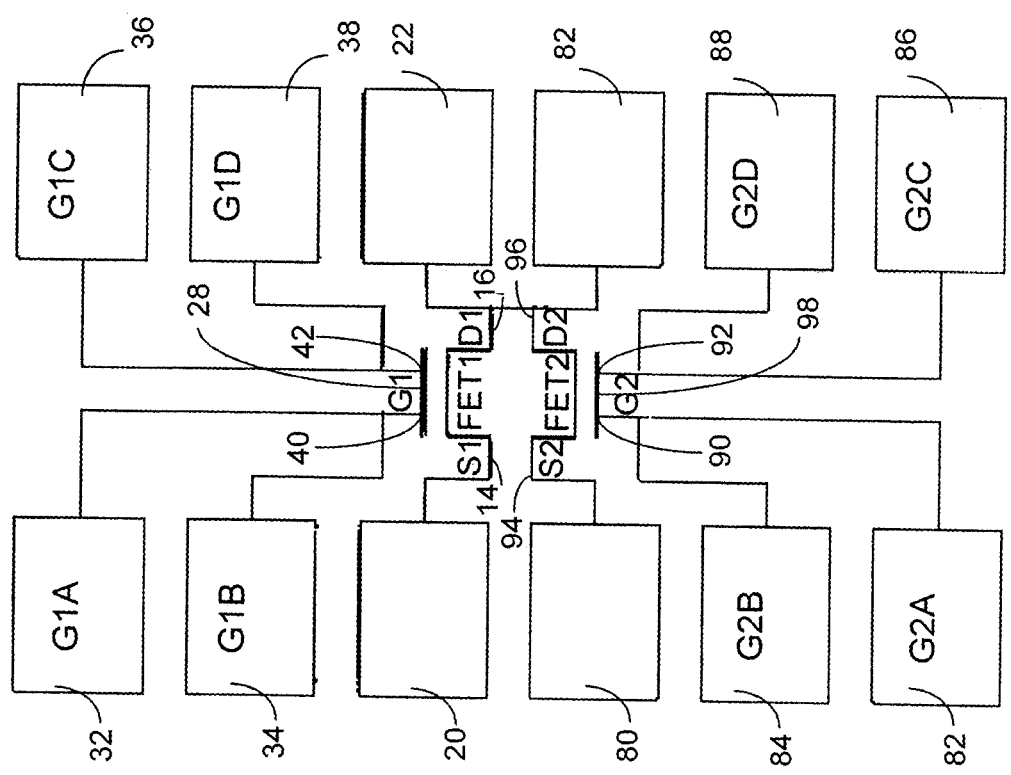
FIG. 5 shows a circuit having two FETs with test structures for monitoring the channel temperature in the FETs in accordance with the present disclosure.

FIG. 5 shows a circuit having two FETs with test structures for monitoring the channel temperature in the FETs in accordance with the present disclosure. Each FET in FIG. 5 has two connections to each end of the gate. For instance, the first gate (G1) 28, has two connections 32 and 34 on a first end of the first gate 28 and a two connections 36 and 38 on a second end of the first gate 28. The second gate (G2) 98, has two connections 82 and 84 on a first end of the second gate 98 and a two connections 86 and 88 on a second end of the second gate 98. The same measurements that are described above in relation to FIG. 3 may be made independently on each gate 28 and 98 to derive the Temperature Coefficient of Resistance (TCR) for each gate 28 and 98, respectively. These TCRs can then be used together with information on the ambient temperature and source drain biases to monitor the channel temperature of each FET.

Although the measurements can be performed independently on each gate, it is expected that the extracted TCR will be identical for both, because the FETs are simultaneously fabricated and in very close proximity. One skilled in the art will understand that FIG. 5 is only one example and that there can be many FETs fabricated in close proximity.

One skilled in the art will understand that the presently claimed invention may be practiced with any FETs including homo-junction FETs and heterojunction FETs and FETs made of various materials including but not limited to Si, GaN, GaAs, InP, and SiC.

Figure 6B:
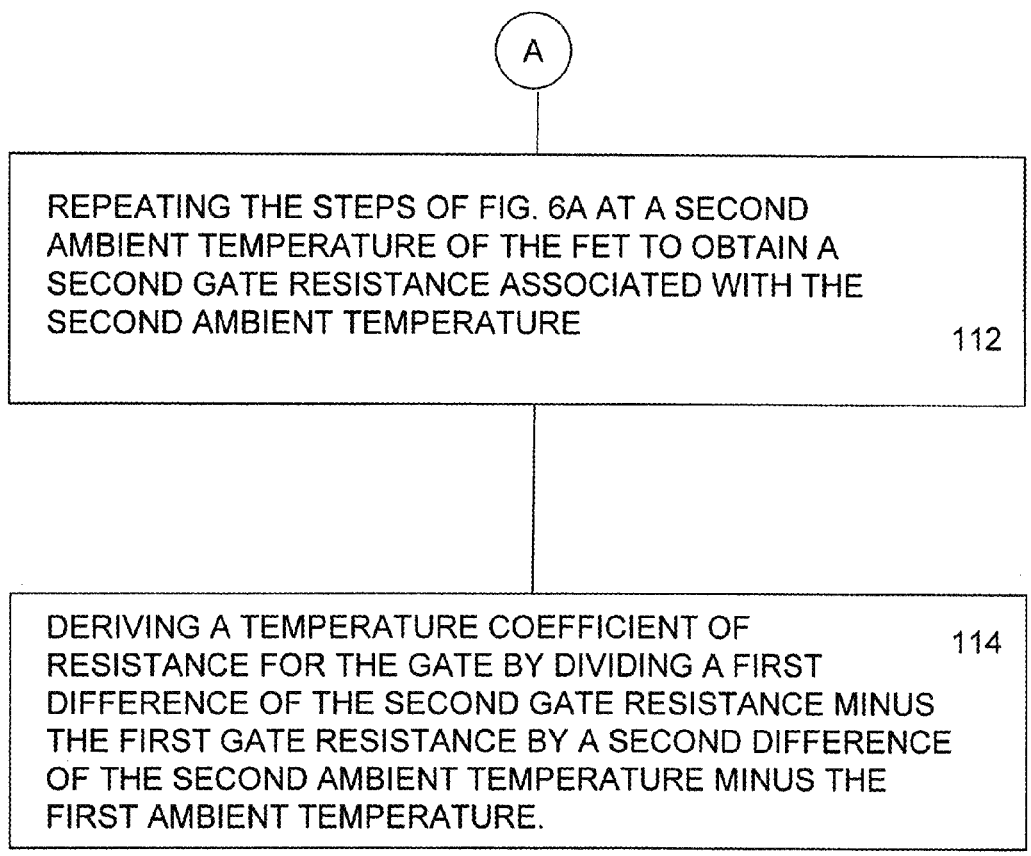

FIGS. 6A-6C A are flow diagrams of a method for monitoring a temperature in a field effect transistor (FET) having a source 14, a drain 16 and a gate 28. In step 100 a FET is provided with a first connection 32 electrically connected to the gate 28 near a first end 40 of the gate 28, a second connection 34 electrically connected to the gate 28 near the first end 40 of the gate 28, a third connection 36 electrically connected to the gate 28 near a second end 42 of the gate 28, and a fourth connection 38 electrically connected to the gate 28 near the second end 42 of the gate 28. In step 102 a first ambient temperature of the FET is sensed. Then in step 104 a first voltage is applied to the first connection 32. Next in step 106 a current is forced into the third connection 36. The first voltage is set to ensure that a current source is formed between the third connection 36 and the first connection 32 and that current flows between the third connection 36 and the first connection 32. Then in step 108 a second voltage is sensed across the second 34 and fourth 38 connections. Then in step 110 the sensed second voltage is divided by the current to obtain a first gate resistance associated with the first ambient temperature.

In step 112 shown in FIG. 6B the steps of FIG. 6A are repeated at a second ambient temperature of the FET to obtain a second gate resistance associated with the second ambient temperature.

Then in step 114 a temperature coefficient of resistance for the gate 28 is derived by dividing a first difference of the second gate resistance minus the first gate resistance by a second difference of the second ambient temperature minus the first ambient temperature.

For further characterization of the FET gate resistance a voltage may be applied across the source 14 and drain 16, so that current flows in the FET channel during the steps of FIGS. 6A and 6B, because during normal operation a source to drain voltage may also be present.

In operation, to determine the temperature of the gate 28 the steps of FIG. 6C may be performed. In step 118 a first voltage is applied to the first connection 32. Next in step 120 a current is forced into the third connection 36. The first voltage is set to ensure that a current source is formed between the third connection 36 and the first connection 32 and that current flows between the third connection 36 and the first connection 32. Then in step 122 a fourth voltage is sensed across the second connection 34 and fourth connection 38. In step 124 the sensed fourth voltage is divided by the current to obtain a third gate resistance for gate 28. Finally, in step 126 the third gate resistance is divided by the derived temperature coefficient of resistance to determine the temperature of gate 28. Because the gate 28 is in very close proximity to the FET channel, the gate temperature is able to accurately measure the temperature of the channel.

Figure 7A:
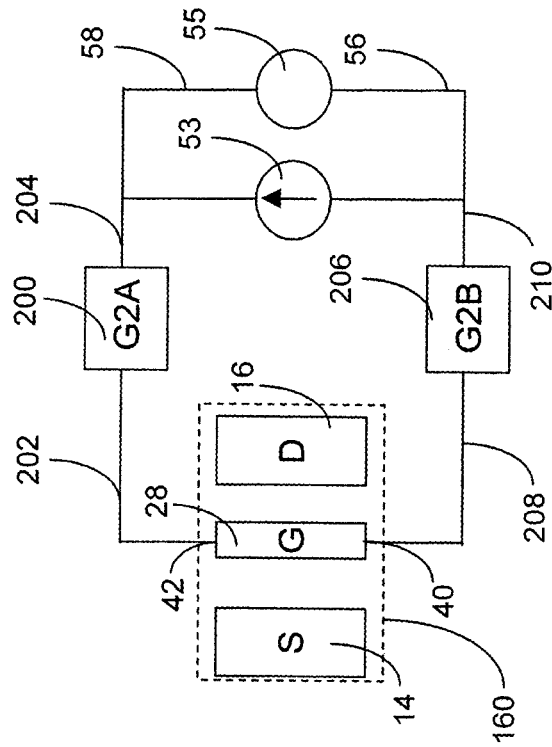
FIG. 7A is a another figure similar to FIG. 2 showing an FET with test structures for monitoring the channel temperature in accordance with the present disclosure.

FIG. 7A is a another figure similar to FIG. 2 showing an FET 150 with test structures for monitoring the channel temperature in accordance with the present disclosure. In FIG. 7A the FET 150 is shown in a top planar view, showing the source 14, the gate 28 and the drain 16. There are connections from near a first end 40 of the gate 28 to pads G1A 32 and G1B 34. There are also connections near the second end 42 of the gate 28 to pads G1A C 36 and G1D 38. A current source 53 is electrically connected between pads G1A 32 and G1C 36, and a voltage monitor 55 is electrically connected between pads G1B 34 and G1D 38. A known current from current source 53 is forced through gate 28 from second end 42 to first end 40, and probes 56 and 58 from voltage monitor 55 are connected to pads G1D 38 and G1B 34. The voltage monitor 55 senses the voltage across the gate 28 caused by the current from the current source 53. By using high impedance probes, which may be Kelvin probes, very little or no current flows through the probes themselves or through the pads G1D 38 and G1B 34 or through the lines 33 and 37, so the voltage measurement in quite accurate. By dividing the sensed voltage by the known current from the current source 53, the resistance across the gate 28 can be determined and given the temperature coefficient of resistance, the temperature of the gate 28 can be determined by dividing the resistance across the gate 28 by the temperature coefficient of resistance, as described above.

Figure 7B:
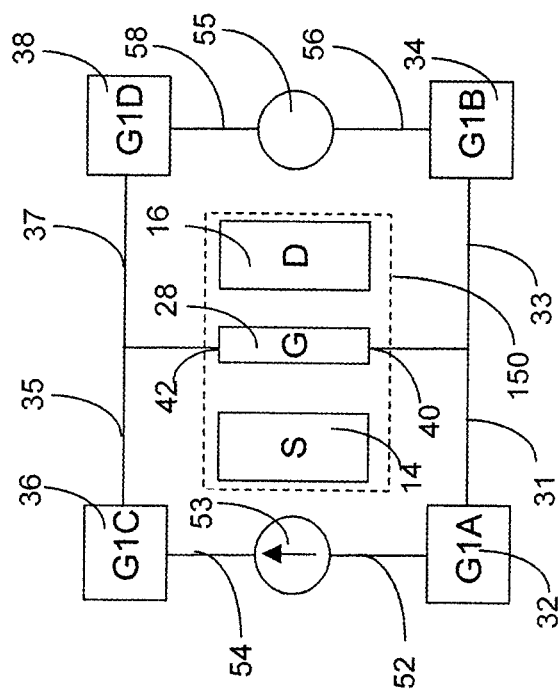
FIG. 7B shows another FET with test structures for monitoring the channel temperature in accordance with the present disclosure.

FIG. 7B shows another embodiment of an FET 160 with test structures for monitoring the channel temperature in accordance with the present disclosure. In FIG. 7B the FET 160 is shown in a top planar view, showing the source 14, the gate 28 and the drain 16. There is a connection from near a first end 40 of the gate 28 to a pad G2B 206. There is also a connection near the second end 42 of the gate 28 to pad G2A 200. A current source 53 is electrically connected between pads G2A 200 and G2B 206, and a voltage monitor 55 is also electrically connected between pads G2A 200 and G2B 206. A known current from current source 53 is forced through gate 28 from second end 42 to first end 40, and probes 56 and 56 from voltage monitor 55, which may be Kelvin probes, are connected to pads G2A 200 and G2B 206. The voltage monitor 55 senses the voltage across the gate 28 caused by the current from the current source 53; however this voltage measurement is less accurate than the system of FIG. 7B, because there may be voltage drops across the pads G2A and G2B and lines 202, 204, 208 and 210 caused by their resistance and the flow of current through them from current source 53. In any event, the inaccuracy of this voltage measurement may be taken into account by calibrating the resistance of the pads and the lines. By dividing the sensed voltage by the known current from the current source 53, the resistance across the gate 28 can be determined and given the temperature coefficient of resistance, the temperature of the gate 28 can be determined by dividing the resistance across the gate 28 by the temperature coefficient of resistance. The system of FIG. 7B is more compact and of sufficient accuracy, while providing cost savings.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method for monitoring a temperature in a field effect transistor (FET) having a source, a drain and a gate, the method comprising:
   providing the FET with a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate;
   sensing a first ambient temperature of the FET;
   forcing a first current from the third connection to the first connection;
   sensing a first voltage across the second and fourth connection; and
   dividing the sensed first voltage by the first current to obtain a first gate resistance associated with the first ambient temperature.

2. The method of claim 1 further comprising:
   sensing a second ambient temperature of the FET;
   forcing a second current from the third connection to the first connection;
   sensing a second voltage across the second connection and the fourth connection; and
   dividing the sensed second voltage by the second current to obtain a second gate resistance associated with the second ambient temperature.

3. The method of claim 2 further comprising:
   deriving a temperature coefficient of resistance for the gate by dividing a first difference of the second gate resistance minus the first gate resistance by a second difference of the second ambient temperature minus the first ambient temperature.

4. The method of claim 2 further comprising:
   forming a lookup table of gate resistance versus temperature.

5. The method of claim 3 further comprising:
   forcing a source to drain voltage;
   forcing a third current from the third connection to the first connection;
   sensing a third voltage across the second and fourth connection;
   dividing the sensed third voltage by the third current to obtain a third gate resistance; and
   dividing the third gate resistance by the derived temperature coefficient of resistance to determine a gate temperature.

6. The method of claim 4 further comprising:
   forcing a source to drain voltage;
   forcing a third current from the third connection to the first connection;
   sensing a third voltage across the second connection and the fourth connection;
   dividing the sensed third voltage by the third current to obtain a fourth gate resistance; and
   using the fourth gate resistance with the lookup table of gate resistance versus temperature to determine a gate temperature.

7. The method of claim 5 wherein the third current is constrained so that the sensed third voltage does not result in a significant difference to a forced gate to source voltage.

8. The method of claim 2 wherein the third current is constrained so that the sensed fourth voltage does not result in a significant difference to a forced gate to source voltage.

9. A method for monitoring a temperature in a field effect transistor (FET) having a source, a drain and a gate, and having a first connection electrically connected to the gate near a first end of the gate, a second connection electrically connected to the gate near the first end of the gate, a third connection electrically connected to the gate near a second end of the gate, and a fourth connection electrically connected to the gate near the second end of the gate, the method comprising:
   providing a temperature coefficient of gate resistance;
   forcing a current from the third connection to the first connection;
   sensing a second voltage across the second connection and the fourth connection;
   dividing the sensed second voltage by the current to obtain a gate resistance; and
   dividing the gate resistance by the provided temperature coefficient of gate resistance to determine a gate temperature.

10. The method of claim 9 wherein the current is limited so that the sensed second voltage does not result in a significant difference to a forced gate to source voltage.

11. A method for monitoring a temperature in a field effect transistor (FET) having a source, a drain and a gate, the method comprising:
    providing the FET with a first connection electrically connected to the gate near a first end of the gate, and a second connection electrically connected to the gate near a second end of the gate;
    sensing a first ambient temperature of the FET;
    forcing a first current from the first connection to the second connection;
    sensing a first voltage between the first connection and the second connection; and
    dividing the sensed first voltage by the first current to obtain a first gate resistance associated with the first ambient temperature.

12. The method of claim 11 further comprising:
    sensing a second ambient temperature of the FET;
    forcing a second current from the first connection to the second connection;
    sensing a second voltage between the first connection and the second connection; and dividing the sensed second voltage by the second current to obtain a second gate resistance associated with the second ambient temperature.

13. The method of claim 12 further comprising:

deriving a temperature coefficient of resistance for the gate by dividing a first difference of the second gate resistance minus the first gate resistance by a second difference of the second ambient temperature minus the first ambient temperature.

14. The method of claim 12 further comprising:

forming a lookup table of gate resistance versus ambient temperature.

15. A method for monitoring a temperature in a field effect transistor (FET) having a source, a drain and a gate, and having a first connection electrically connected to the gate near a first end of the gate, and a second connection electrically connected to the gate near a second end of the gate, the method comprising:

providing a temperature coefficient of gate resistance;

forcing a current from the first connection to the second connection;

sensing a voltage between the first connection and the second connection;

dividing the sensed voltage by the current to obtain a gate resistance; and dividing the gate resistance by the provided temperature coefficient of gate resistance to determine a gate temperature.

16. The method of claim 15 wherein the current is limited so that the sensed voltage does not result in a significant difference to a forced gate to source voltage.

* * * * *